United States Patent
Yamada et al.

(10) Patent No.: US 10,202,524 B2
(45) Date of Patent: Feb. 12, 2019

(54) ANISOTROPIC CONDUCTIVE FILM, CONNECTION METHOD, AND JOINED BODY

(71) Applicant: DEXERIALS CORPORATION, Shinagawa-ku, Tokyo (JP)

(72) Inventors: Yasunobu Yamada, Kanuma (JP); Morio Sekiguchi, Kanuma (JP); Susumu Kumakura, Kanuma (JP)

(73) Assignee: DEXERIALS CORPORATION, Shinagawa-Ku, Tokyo (JP)

( * ) Notice: Subject to any disclaimer, the term of this patent is extended or adjusted under 35 U.S.C. 154(b) by 110 days.

(21) Appl. No.: 15/124,900

(22) PCT Filed: Feb. 10, 2015

(86) PCT No.: PCT/JP2015/053659
§ 371 (c)(1),
(2) Date: Sep. 9, 2016

(87) PCT Pub. No.: WO2015/137033
PCT Pub. Date: Sep. 17, 2015

(65) Prior Publication Data
US 2017/0210947 A1     Jul. 27, 2017

(30) Foreign Application Priority Data
Mar. 11, 2014  (JP) ................................ 2014-047154

(51) Int. Cl.
| C09J 9/02 | (2006.01) |
| C09J 7/00 | (2018.01) |
| H01B 1/22 | (2006.01) |
| C09J 11/04 | (2006.01) |
| H01B 1/12 | (2006.01) |
| H01L 23/00 | (2006.01) |
| H01R 4/04 | (2006.01) |
| C09J 7/10 | (2018.01) |
| C08L 75/04 | (2006.01) |
| C09J 167/00 | (2006.01) |
| C09J 175/04 | (2006.01) |

(52) U.S. Cl.
CPC . *C09J 7/00* (2013.01); *C09J 7/10* (2018.01); *C09J 9/02* (2013.01); *C09J 11/04* (2013.01); *H01B 1/124* (2013.01); *H01B 1/22* (2013.01); *H01L 24/29* (2013.01); *H01L 24/83* (2013.01); *H01R 4/04* (2013.01); *C08K 2201/001* (2013.01); *C08L 75/04* (2013.01); *C09J 167/00* (2013.01); *C09J 175/04* (2013.01); *C09J 2201/602* (2013.01); *C09J 2201/61* (2013.01); *C09J 2201/622* (2013.01); *C09J 2203/326* (2013.01); *C09J 2205/102* (2013.01); *C09J 2467/00* (2013.01); *C09J 2475/00* (2013.01); *H01L 2224/2929* (2013.01); *H01L 2224/2939* (2013.01); *H01L 2224/29439* (2013.01); *H01L 2224/29499* (2013.01); *H01L 2224/83191* (2013.01); *H01L 2224/83193* (2013.01); *H01L 2224/83203* (2013.01); *H01L 2924/01047* (2013.01)

(58) Field of Classification Search
CPC .......................................................... C09J 9/02
See application file for complete search history.

(56) References Cited

U.S. PATENT DOCUMENTS

| 5,370,820 A | 12/1994 | Boden et al. | |
| 6,620,343 B1 * | 9/2003 | Blok ................ | H01C 17/06586 252/511 |
| 2002/0043728 A1 | 4/2002 | Harada | |
| 2003/0029559 A1 | 2/2003 | Yamada et al. | |
| 2015/0237725 A1 | 8/2015 | Yamada et al. | |

FOREIGN PATENT DOCUMENTS

| EP | 1 184 419 A2 | 3/2002 |
| EP | 2 884 590 A1 | 6/2015 |
| JP | H02-208391 | 8/1990 |
| JP | H05-154857 A | 6/1993 |
| JP | 2002-105221 A | 4/2002 |

(Continued)

OTHER PUBLICATIONS

"Polyethylene" from plasticmoulding.ca as captured by archive.org Dec. 2006.*
Machine translation of KR 10-0622578 B1, Sep. 13, 2006. (Year: 2006).*
International Search Report (PCT/ISA/210) dated Apr. 4, 2015, by the Japan Patent Office as the International Searching Authority for International Application No. PCT/JP2015/053659.
Written Opinion (PCT/ISA/237) dated Apr. 4, 2015, by the Japan Patent Office as the International Searching Authority for International Application No. PCT/JP2015/053659.

(Continued)

*Primary Examiner* — Vickey Nerangis
(74) *Attorney, Agent, or Firm* — Buchanan, Ingersoll & Rooney PC

(57) ABSTRACT

An anisotropic conductive film for anisotropically conductively connecting a terminal of a first electronic component and a terminal of a second electronic component, the anisotropic conductive film including: a conductive particle-containing layer, which contains an adhesive layer-forming component and conductive particles, wherein the conductive particle-containing layer has two endothermic peaks in differential scanning calorimetry where endothermic peak temperatures are measured under conditions that a measuring temperature range is from 10° C. to 250° C. and a heating speed is 10° C./min, and wherein T2 is 30° C. or higher, and T4−T2 is greater than 0° C. but 80° C. or less, where T2 is a temperature of the endothermic peak present at a lower temperature side, and T4 is a temperature of the endothermic peak present at a higher temperature side.

15 Claims, No Drawings

(56) References Cited

FOREIGN PATENT DOCUMENTS

| | | | |
|---|---|---|---|
| JP | 2007-262412 A | 10/2007 | |
| KR | 100622578 B1 * | 9/2006 | ............. H01L 24/29 |
| WO | WO 2009/038190 A1 | 3/2009 | |

OTHER PUBLICATIONS

Bowen: "Particle Size Distribution Measurement from Millimeters to Nanometers and from Rods to Platelets," Journal of Dispersion Science and Technology, (2002), vol. 23, No. 5, pp. 631-662.
Extended Search Report dated Oct. 11, 2017, by the European Patent Office in corresponding European Patent Application No. 15761023.9-1302. (9 pages).

* cited by examiner

ANISOTROPIC CONDUCTIVE FILM, CONNECTION METHOD, AND JOINED BODY

TECHNICAL FIELD

The present invention relates to an anisotropic conductive film, a connecting method, and a joined structure.

BACKGROUND ART

As for the means for connecting electronic parts to each other, anisotropic conductive films (ACFs) have been conventionally used.

The anisotropic conductive film is produced by applying a resin mixture containing conductive particles onto a release film, and drying the resin mixture. A method for connecting between electronic components is a method where the anisotropic conductive film formed on the release film is placed on one of circuits to be connected (or both circuits to be connected), the predetermined temperature and pressure are applied from the side of the release film to temporarily bond, the release film is peeled, the resultant is positioned on the other circuit, and the predetermined temperature and pressure are applied for the predetermined period to bond (or temporary-bonding may be performed at the predetermined temperature and pressure for the predetermined period after the positioning, followed by performing bonding) to thereby perform electric connection between the circuits.

In order to improve workability of an assembling step for electronic components and to enable highly reliable electric connection in temporary bonding before peeling a release film or temporary bonding before final bonding, the conductive particle-containing layer needs to have sufficient adhesion. This is because the conductive particle-containing layer is peeled off from a circuit board to be connected when the release film is peeled, if adhesion of the conductive particle-containing layer in the anisotropic conductive film is poor. Moreover, the conductive particle-containing layer and the release film may be peeled off from each other, for example, when the release film has high releasability and the anisotropic conductive film is pulled out from a roll for use. If the releasability of the release film is poor, the conductive particle-containing layer is peeled off together with the release film, when the release film is peeled off after temporary-bonding. Therefore, it is important that the conductive particle-containing layer and the release film have appropriate releasability and adhesion.

Accordingly, there is a need for an anisotropic conductive film having excellent temporary-fixing properties satisfying the aforementioned demands at the time of temporary-bonding. For example, an anisotropic conductive film whose temporary-bonding properties have been improved by blending a liquid epoxy resin into a thermoset resin is known (see PTL 1).

However, the proposed anisotropic conductive film is not satisfactory in terms of practical use and workability, and needs further improvements.

Moreover, there has recently been a demand for connecting electronic components to each other at a low temperature for a short period. Therefore, non-reaction-type anisotropic conductive films that enable to connect electronic components at a low temperature for a short period have been studied.

It has been however found that heat resistance of a non-reaction-type anisotropic conductive film is signifi-cantly impaired, if a liquid material, such as a material used in the aforementioned thermoset resin anisotropic conductive film, is blended in the non-reaction-type anisotropic conductive film to improve temporary-fixing properties. The non-reaction-type anisotropic conductive film has a problem that a problem associated with temporary-fixing properties becomes significant.

Accordingly, there is a need for a non-reaction-type anisotropic conductive film having excellent temporary-fixing properties.

Moreover, anisotropic conductive films have been conventionally used for connection of fine wirings unsuitable for solider connection. Since low temperature connection is realized, anisotropic conductive films have been used for connection of relatively rough wirings.

An anisotropic conductive film originally designed for fine wirings is bonded with a small area, and achieves conduction, as a conductive particle-containing layer is flown outside a terminal region by squashing a binder forming the conductive particle-containing layer to make a thickness of the conductive particle-containing layer thinner than diameters of conductive particles, and as a result, the conductive particles are crushed. In the case where a terminal region of a relative large area is attempted to be connected, however, a curing reaction is caused at around a center part of the conductive particle-containing layer of the large area to increase viscosity before flowing into outside the terminal region, and thus the conductive particle-containing layer is not flown outside the terminal region and cannot be made thin. Therefore, the conductive particles are not crushed sufficiently, and excellent conduction cannot be obtained.

On the other hand, non-reaction-type anisotropic conductive films, which do not carry out a curing reaction, do not increase viscosity along with a curing reaction. Accordingly, the non-reaction-type anisotropic conductive films do not have the aforementioned problem, and can achieve excellent conduction.

In case of the non-reaction-type anisotropic conductive films, however, there are problems that tackiness is low and the aforementioned temporary-fixing properties are poor because the non-reaction-type anisotropic conductive film contains a crystalline material having a melting point.

CITATION LIST

Patent Literature

PTL 1 Japanese Patent Application Laid-Open (JP-A) No. 05-154857

SUMMARY OF INVENTION

Technical Problem

The present invention aims to solve the aforementioned various problems in the art, and achieve the following object. Specifically, the present invention has an object to provide an anisotropic conductive film, which can assure excellent conduction at a center part of connection, particularly with a relatively large area, with maintaining sufficient connection resistance, and has excellent temporary-fixing properties, where a conductive particle-containing film contained in the anisotropic conductive film has sufficient adhesion to a substrate that is a target for connection, and the conductive particle-containing layer and a release film have sufficient releasability and adhesion, as well as providing a connecting method and a joined structure both using the anisotropic conductive film.

Solution to Problem

The means for solving the aforementioned problems as follows:

<1> An anisotropic conductive film for anisotropically conductively connecting a terminal of a first electronic component and a terminal of a second electronic component, the anisotropic conductive film including:

a conductive particle-containing layer, which contains an adhesive layer-forming component and conductive particles, wherein the conductive particle-containing layer has two endothermic peaks in differential scanning calorimetry where endothermic peak temperatures are measured under conditions that a measuring temperature range is from 10° C. to 250° C. and a heating speed is 10° C./min, and wherein T2 is 30° C. or higher, and T4−T2 is greater than 0° C. but 80° C. or less, where T2 is a temperature of the endothermic peak present at a lower temperature side, and T4 is a temperature of the endothermic peak present at a higher temperature side.

<2> The anisotropic conductive film according to <1>, wherein the adhesive layer-forming component contains a crystalline resin.

<3> The anisotropic conductive film according to <2>, wherein the crystalline resin contains at least two crystalline resins including a first crystalline resin and a second crystalline resin.

<4> The anisotropic conductive film according to <3>, wherein the adhesive layer-forming component further contains an amorphous resin.

<5> The anisotropic conductive film according to any one of <1> to <4>, wherein an average thickness of the conductive particle-containing layer is from 80% to 140% relative to an average particle diameter of the conductive particles.

<6> The anisotropic conductive film according to any one of <3> to <5>, wherein a ratio of a mass of the first crystalline resin to a mass of the second crystalline resin is from 25:75 to 75:25.

<7> The anisotropic conductive film according to any one of <4> to <6>, wherein a ratio (X):(Y) is from 25:75 to 75:25, where (X) is the sum of a mass of the first crystalline resin and a mass of the second crystalline resin and (Y) is a mass of the amorphous resin.

<8> The anisotropic conductive film according to any one of <4> to <7>, wherein the first crystalline resin contains crystalline polyester, the second crystalline resin contains a crystalline polyurethane resin, and the amorphous resin contains an amorphous polyester resin.

<9> The anisotropic conductive film according to any one of <1> to <8>, wherein an average particle diameter of the conductive particles is from 2 µm to 40 µm.

<10> A connecting method for anisotropically conductively connecting a terminal of a first electronic component and a terminal of a second electronic component, the connecting method including:

arranging the conductive particle-containing layer of the anisotropic conductive film according to any one of <1> to <9> on the terminal of the second electronic component to perform a first arrangement;

arranging the first electronic component on the conductive particle-containing layer to bring the terminal of the first electronic component into contact with the conductive particle-containing layer to perform a second arrangement; and heating and pressing the first electronic component with a heat-press member.

<11> The connecting method according to <10>, wherein a contact area when the terminal of the first electronic component and the terminal of the second electronic component are anisotropically conductively connected is 100 mm² or greater.

<12> A joined structure connected by the connecting method according to <10> or <11>.

Advantageous Effects of the Invention

The present invention can solve the aforementioned various problems in the art and achieve the aforementioned object, and can provide an anisotropic conductive film, which can assure excellent conduction at a center part of connection, particularly with a relatively large area, with maintaining sufficient connection resistance, contains a conductive particle-containing film having sufficient adhesion to a substrate that is a target for connection, has sufficient releasability and adhesion between the conductive particle-containing layer and a release film, and has excellent temporary-fixing properties between facing parts, as well as providing a connecting method and a joined structure both using the anisotropic conductive film.

DESCRIPTION OF EMBODIMENTS (Anisotropic Conductive Film)

The anisotropic conductive film of the present invention includes at least a conductive particle-containing layer, and may further include other layers or other components, such as a releasable base, according to the necessity.

The anisotropic conductive film is an anisotropic conductive film for anisotropically conductively connecting a terminal of a first electronic component and a terminal of a second electronic component.

The anisotropic conductive film has the following characteristics.

In differential scanning calorimetry where endothermic peak temperatures are measured under conditions that a measuring temperature range is from 10° C. to 250° C. and a heating speed is 10° C./min, T2 is 30° C. or higher, and T4−T2 is greater than 0° C. but 80° C. or less, where the conductive particle-containing layer has two endothermic peaks, T2 is a temperature of the endothermic peak present at a lower temperature side, and T4 is a temperature of the endothermic peak present at a higher temperature side.

The anisotropic conductive film of the present invention having the aforementioned characteristics is an anisotropic conductive film, which assures excellent conduction at a center part of connection with a relatively large area, and has excellent temporary-fixing properties.

As for a preferable embodiment when a below-mentioned joined structure is produced using the anisotropic conductive film of the present invention, there is an embodiment where T2 and T4 are set to satisfy the relationship represented by the following formula (1) in differential scanning calorimetry performed under conditions that the measuring temperature range is from 10° C. to 250° C. and the heating speed is 10° C./min, where T1 is room temperature at which the anisotropic conductive film is used, T3 is a temperature for temporary-bonding, and T5 is a temperature for bonding.

$$T1 < T2 < T3 < T4 < T5 \tag{1}$$

According to the aforementioned embodiment, part of the material in the conductive particle-containing layer is melted at the temporary-bonding temperature because of the presence of T2. Therefore, the conductive particle-containing layer generates tackiness to improve temporary-fixing properties. The crystalline material in the conductive particle-containing layer is in a crystalline state at T1, and therefore the conductive particle-containing layer does not have tackiness or have only slight tackiness to make handling of the conductive particle-containing layer easy, leading to excellent handling.

T4 is present at a temperature lower than T5. It has been difficult to achieve conduction at a center part of a large area with a reaction-type anisotropic conductive film. Since T4 is present at a temperature lower than T5, the adhesive layer-forming component of the anisotropic conductive film of the present invention can be flown outside the terminal region to crush conductive particles, and therefore excellent conduction can be assured.

In order to obtain the anisotropic conductive film having the desired T2 and T4, crystalline materials having endothermic peaks at desired temperatures may be blended. The crystalline materials are described later.

<Differential Scanning Calorimetry (DSC)>

When a measurement of DSC is performed under the following conditions, an endothermic onset temperature, an endothermic peak temperature, and an endothermic value at the time of heating can be determined.

Measuring Device: Q100, manufactured by TA Instruments Japan Inc.
Measuring Sample: 5 mg
Measuring Temperature Range: from 10° C. to 250° C.
Heating Speed: 10° C./min <Conductive Particle-Containing Layer>

The conductive particle-containing layer contains at least an adhesive layer-forming component and conductive particles, and may further contain other components according to the necessity.

<<Adhesive Layer-Forming Component>>

The adhesive layer-forming component is not particularly limited and may be appropriately selected depending on the intended purpose. Examples of the adhesive layer-forming component include a crystalline resin and an amorphous resin.

Among the above-listed examples, use of the crystalline resin and the amorphous resin in combination is preferable because connection with electronic components can be achieved at a low temperature for a short period of time while sufficiently maintaining connection resistance of the anisotropic conductive film. Moreover, in a case where two or more crystalline resins are used as the crystalline resin, and the two or more crystalline resins and the amorphous resin are used in combination, such use of the two or more crystalline resins and the amorphous resin in combination is more preferable because excellent conduction is assured at a center part of connection, particularly, with a relatively large area, with maintaining sufficient connection resistance of the anisotropic conductive film, excellent temporary-fixing properties are obtained, and connection of electronic components can be realized at a low temperature for a short period.

—Crystalline Resin—

The crystalline resin is not particularly limited and may be appropriately selected depending on the intended purpose, expect that the crystalline resin is a resin containing a crystalline region. Examples of the crystalline resin include a polyester resin, a polyurethane resin, and a polyolefin resin. Whether the resin is the crystalline resin can be confirmed, for example, by the presence of an endothermic peak observed during heating in differential scanning calorimetry.

In the present invention, two or more crystalline resins are contained to obtain the anisotropic conductive film having the desired T2 and T4.

A particularly preferable embodiment is that a first crystalline resin among the two or more crystalline resins is a crystalline polyester resin, and a second crystalline resin among the crystalline resins is a crystalline polyurethane resin.

In the present invention, another crystalline resin may be further contained in addition to the first crystalline resin and the second crystalline resin. For example, the aforementioned another crystalline resin may be a crystalline polyester resin different from the first crystalline resin, a crystalline polyurethane resin different from the second crystalline resin, or another crystalline resin, such as a crystalline polyolefin resin, that is not either a crystalline polyester resin or a crystalline polyurethane resin.

Examples of the polyester resin include a polyethylene terephthalate resin and a polybutylene terephthalate resin.

Examples of the polyolefin resin include a polyethylene resin, a polypropylene resin, and a polybutylene resin.

A ratio of a mass (g) of the first crystalline resin to a mass (g) of the second crystalline resin is preferably from 25:75 to 75:25, more preferably from 30:70 to 70:30.

—Amorphous Resin—

Examples of the amorphous resin includes the same resins listed as examples in the description of the crystalline resin.

In the case where the amorphous resin and the crystalline resin are used in combination in the present invention, the same kind of resins are preferably used as the amorphous resin and the crystalline resin in combination. For example, preferred are a combination of a crystalline polyester resin and an amorphous polyester resin, a combination of a crystalline polyurethane resin and an amorphous polyurethane resin, and a combination of a crystalline polyolefin resin and an amorphous polyolefin resin. When the same kind of resins are used as the crystalline resin and the amorphous resin in combination, the crystalline resin and the amorphous resin are mixed to create a state where the crystalline resin is easily dissolved in a solvent, and therefore a conductive particle-containing layer homogeneously containing the crystalline resin can be obtained.

The obtained conductive particle-containing layer can achieve connection at a low temperature for a short period. The reason for this is assumed as follows. The conductive particle-containing layer is quickly solidified due to the crystalline resin, when the heated state is returned to a normal temperature, after heating and softening the conductive particle-containing layer.

In the case where two or more crystalline resins are contained in the conductive particle-containing layer in the present invention, and a crystalline polyester resin and a crystalline polyurethane resin are contained as the crystalline resins, either an amorphous polyester resin or an amorphous polyurethane resin is preferably used as the amorphous resin, but use of the amorphous polyester resin as the amorphous resin is more preferable because flexibility is imparted to a resulting film at room temperature.

A ratio of the sum (X) (g) of a mass of the first crystalline resin and a mass of the second crystalline resin to a mass (Y) (g) of the amorphous resin is preferably (X):(Y)=25:75 to 75:25, and more preferably (X):(Y)=40:60 to 60:40.

<<Conductive Particles>>

The conductive particles are not particularly limited and may be appropriately selected depending on the intended purpose. Examples of the conductive particles include metal particles and metal-coated resin particles.

The metal particles are not particularly limited and may be appropriately selected depending on the intended purpose. Examples of the metal particles include nickel, cobalt, silver, copper, gold, palladium, and solder. These may be used alone or in combination.

Among them, preferred are nickel, silver, and copper. Surfaces of these metal particles may be coated with gold or palladium for the purpose of preventing surface oxidization. Moreover, metal particles, to each surface of which metal protrusions or an insulating coating film formed of an organic material may be provided, may be used.

The metal-coated resin particles are not particularly limited and may be appropriately selected depending on the intended purpose, expect that the metal-coated resin particles are particles, in each of which a surface of a resin particle is covered with a metal. Examples of the metal-coated resin particles include particles, in each of which a surface of a resin particle is covered with at least one metal selected from the group consisting of nickel, silver, solder, copper, gold, and palladium. Moreover, metal-coated resin particles, to each surface of which metal protrusions or an insulating coating film formed of an organic material may be provided, may be used. In case of connection considering low resistance, use of particles, in each of which a surface of a resin particle is covered with silver, is preferable.

A method for covering the resin particles with a metal is not particularly limited and may be appropriately selected depending on the intended purpose. Examples of the method include electroless plating and sputtering.

A material of the resin particles is not particularly limited and may be appropriately selected depending on the intended purpose. Examples of the material include a styrene-divinylbenzene copolymer, a benzoguanamine resin, a crosslinked polystyrene resin, an acrylic resin, and a styrene-silica composite resin.

The conductive particles are not particularly limited as long as they have conductivity when anisotropic conductive connection is made. For example, particles, in each of which an insulating coating film is provided on a metal particle, are the aforementioned conductive particles, as long as the particles are deformed to expose the metal particles at the time when anisotropic conductive connection is made.

The average particle diameter of the conductive particles is not particularly limited and may be appropriately selected depending on the intended purpose. The average particle diameter is preferably from 2 μm to 40 μm, more preferably from 5 μm to 30 μm, even more preferably from 10 μm to 25 μm, and particularly preferably from 10 μm to 20 μm.

The average particle diameter is an average value of particle diameters arbitrarily measured on 10 conductive particles.

For example, the particle diameters can be measured by observing under a scanning electron microscope.

An amount of the conductive particles is not particularly limited and may be appropriately selected depending on the intended purpose.

<Releasable Base>

The releasable base is not particularly limited, as long as the releasable base is a film that can be peeled off from the conductive particle-containing layer at the time of temporary-bonding. For example, a releasable base having a contact angle of 80° or greater relative to water can be used.

Moreover, examples of the releasable base include a silicone-based film, a fluorine-based film, and PET, PEN, and glassine paper treated with a releasing agent, such as a silicone-based releasing agent and a fluorine-based releasing agent. Among the above-listed examples, a silicone-based releasable base is preferable.

The average thickness of the releasable base is not particularly limited and may be appropriately selected depending on the intended purpose. The average thickness of the releasable base is preferably from 12 μm to 75 μm.

<Production Method of Anisotropic Conductive Film>

In the present invention, the anisotropic conductive film may be produced by the following steps.

The anisotropic conductive film is produced by: a varnish preparation step of dissolving the adhesive layer-forming component in a solvent to prepare a varnish; an anisotropic conductive composition preparation step of adding conductive particles to the varnish to obtain an anisotropic conductive composition; and a step of applying the anisotropic conductive composition onto a releasable base and drying the anisotropic conductive composition.

The solvent used for the adhesive layer-forming component is not particularly limited and may be appropriately selected depending on the intended purpose. For example, a mixed solvent of methyl ethyl ketone, toluene, and cyclohexanone (methyl ethyl ketone:toluene:cyclohexanone=50:40:10 (mass ratio)) or a mixed solvent of toluene and ethyl acetate (toluene:ethyl acetate=50:50 (mass ratio)) may be used.

<First Electronic Component and Second Electronic Component>

The first electronic component and the second electronic component are not particularly limited and may be appropriately selected depending on the intended purpose, except that the first electronic component and the second electronic component are electronic components having terminals, which are to be targets for anisotropic conductive connection using the anisotropic conductive film. Examples of the first electronic component and the second electronic component include glass substrates, flexible substrates, rigid substrates, integrated circuit (IC) chips, tape automated bonding (TAB), and liquid crystal panels. Examples of the glass substrates include Al wire-formed glass substrates, and ITO wire-formed glass substrates. Examples of the IC chips include IC chips for controlling liquid crystal displays used in flat panel displays (FPD).

The average thickness of the conductive particle-containing layer in the anisotropic conductive film is not particularly limited and may be appropriately selected depending on the intended purpose. The average thickness of the conductive particle-containing layer is preferably from 5 μm to 50 μm, and more preferably from 8 μm to 16 μm.

In the present invention, the average thickness of the conductive particle-containing layer is more preferably set considering the average particle diameter of the conductive particles. As for the average thickness of the conductive particle-containing layer, the average thickness may be from 80% to 140% relative to the average particle diameter of the conductive particles.

(Connecting Method)

The connecting method of the present invention includes at least a first arrangement step, a second arrangement step, and a heat press step, and may further include other steps, such as a release step of a releasable base, according to the necessity.

The connecting method is a method for anisotropically conductively connecting a terminal of a first electronic component and a terminal of a second electronic component.

The first electronic component and the second electronic component are not particularly limited and may be appropriately selected depending on the intended purpose. Examples of the first electronic component and the second electronic component include the first electronic components and the second electronic components listed as examples in the description of the anisotropic conductive film of the present invention.

Use of the anisotropic conductive film of the present invention can assure excellent conduction at a center part through connection with a large area. Accordingly, use of the anisotropic conductive film of the present invention can excellently connect a terminal of a first electronic component and a terminal of a second electronic component together when a contact area for anisotropic conductive connection between the terminal of the first electronic component and the terminal of the second electronic component is 100 mm$^2$ or greater.

<First Arrangement Step>

The first arrangement step is not particularly limited and may be appropriately selected depending on the intended purpose, except that the first arrangement step is arranging the conductive particle-containing layer of the anisotropic conductive film of the present invention on a terminal of the second electronic component.

<Second Arrangement Step>

The second arrangement step is not particularly limited and may be appropriately selected depending on the intended purpose, except that the second arrangement step is arranging the first electronic component on the conductive particle-containing layer to bring a terminal of the first electronic component into contact with the conductive particle-containing layer.

<Heat Press Step>

The heat press step is not particularly limited and may be appropriately selected depending on the intended purpose, except that the heat press step is heating and pressing the first electronic component with a heat press member.

Examples of the heat press member include a press member having a heating system. Examples of the press member having a heating system include a heat tool.

A temperature of the heating is not particularly limited and may be appropriately selected depending on the intended purpose. The temperature is preferably from 100° C. to 140° C.

Pressure of the pressing is not particularly limited and may be appropriately selected depending on the intended purpose. The pressure is preferably from 2 MPa to 6 MPa.

A duration of the heating and pressing is not particularly limited and may be appropriately selected depending on the intended purpose. The duration is preferably from 2 minutes to 20 minutes.

<Other Steps>

<<Releasing Step of Releasable Base>>

Examples of the aforementioned other steps include a releasing step of a releasable base containing releasing the releasable base of the anisotropic conductive film from the conductive particle-containing layer.

(Joined Structure)

The joined structure of the present invention is not limited as long as the joined structure is a joined structure connected by the aforementioned connecting method. The joined structure includes at least a first electronic component, a second electronic component, and a conductive particle-containing layer, and may further include other members according to the necessity.

EXAMPLES

The present invention will be more specifically explained through Examples and Comparative Examples hereinafter, but the present invention is not limited to Examples. Note that, "part(s)" denotes "part(s) by mass."

Example 1

<Production of Anisotropic Conductive Film>

A solution was produced by mixing and stirring 80 parts by mass of ARONMELT PES-111EE (manufactured by TOAGOSEI CO., LTD., a crystalline resin a main component of which was a crystalline polyester resin) serving as a first crystalline resin A1, 40 parts by mass of DESMOCOLL 540 (manufactured by Sumika Bayer Urethane Co., Ltd., a crystalline linear polyurethane resin) serving as a second crystalline resin A2, 80 parts by mass of ELITEL UE3500 (manufactured by UNITIKA LTD., an amorphous polyester resin, weight average molecular weight: 30,000) serving as an amorphous resin A3, and 400 parts by mass of a mixed solvent (methyl ethyl ketone (MEK):toluene:cyclohexanone=50:40:10 (mass ratio)), to thereby obtain a varnish mixture.

Subsequently, 5 parts by mass of spherical Ag-plated resin particles having the average particle diameter of 10 μm (conductive particles obtained by the following production method) was added to the varnish mixture to obtain an anisotropic conductive composition.

The obtained anisotropic conductive composition was applied onto a polyethylene terephthalate (PET) film treated with a silicone-based releasing agent and having the average thickness of 50 μm in a manner that the average thickness of the anisotropic conductive composition after drying was to be 12 μm. The applied anisotropic conductive composition was dried at 70° C. for 10 minutes to produce an anisotropic conductive film.

—Production of Silicone-Based Releasing Agent Treated Film—

To a mixed solvent containing 40 parts by mass of toluene and 47 parts by mass of methyl ethyl ketone, 13 parts by mass of an addition-reactable silicone solution (product name "KS-847" manufactured by Shin-Etsu Chemical Co., Ltd., silicone concentration: 30% by mass) and 0.3 parts by mass of a platinum curing catalyst (product name "PL-50T" manufactured by Shin-Etsu Chemical Co., Ltd.) were added to prepare a coating liquid for a releasing layer.

The coating liquid for a releasing layer was applied onto a PET film, both surfaces of which had been untreated, to give the average thickness of 50 μm, and the applied coating liquid was dried to thereby obtain a silicone-based release film.

Note that, a coil bar was used for the application of the coating liquid. As for the curing of the coated layer, the entire coated layer was heated at 160° C. for 1 minute. The average thickness of the silicone-based releasing agent after being dried was 0.1 μm.

—Production of Conductive Particles—

—Production of Divinyl Benzene-Based Resin Particles—

To a solution, in which a blending ratio of divinyl benzene, styrene, and butyl methacrylate was adjusted, benzoyl peroxide was added as a polymerization initiator. The resultant was heated with homogeneously stirring at high speed to perform a polymerization reaction, to thereby obtain a particle dispersion liquid. The particle dispersion liquid was subjected to filtration, followed by being dried under reduced pressure, to thereby obtain a block body that was an aggregated body of the particles. Moreover, the block body was ground to obtain divinyl benzene-based resin particles.

—Silver Plating of Resin Particles—

To a solution prepared by dissolving 4.25 g of silver nitrate serving as a silver salt in 625 mL of pure water at room temperature, 15 g of benzimidazole serving as a reducing agent was added. After confirming that the initially generated sediment was completely dissolved, 5 g of succinic acid imide and 3 g of citric acid monohydrate were dissolved therein as complexing agents. Thereafter, 13 g of glyoxylic acid serving as a crystal-adjusting agent was added thereto and was completely dissolved, to thereby prepare an electroless silver plating solution.

Subsequently, the divinylbenzene-based resin particles obtained above were added to the electroless silver plating solution, and the resultant was heated with stirring and the temperature of the solution was maintained to 50° C. Thereafter, the particles therein were separated by filtration with Buchner funnel, and the separated particles were dried by means of a vacuum drier at 80° C. for 2 hours, to thereby obtain spherical Ag-plated resin particles (conductive particles) having the average particle diameter of 10 μm.

<Differential Scanning Calorimetry (DSC)>

A measurement of DSC was performed on the conductive particle-containing layer of the above-obtained anisotropic conductive film of the present invention under the following conditions to determine endothermic peak temperatures (T2 and T4) at the time of heating. The results are presented in Table 1-1. In the case where it was difficult to recognize an endothermic peak, the temperature, at which the endothermic value was the maximum between two points, the endothermic onset temperature and the endothermic end temperature, in the endothermic temperature region, was determined as an endothermic peak temperature.

Measuring Device: Q100, manufactured by TA Instruments Japan Inc.
Measuring Sample: 5 mg
Measuring Temperature Range: 10° C. to 250° C.
Heating Speed: 10° C./min <Evaluation of Laminating Properties>

A PET film having the average thickness of 25 μm was set on a hot stage a temperature of which was adjusted to 70° C. The anisotropic conductive film of the present invention cut into a size of 50 mm×25 mm was arranged on the PET film. After pressing the stuck of the PET film and the anisotropic conductive film by running a hand roller of 5 kg over and back twice, the releasable base (silicone-based release-treated film) was peeled off from the anisotropic conductive film. The evaluation was performed based on the following criteria. A result is presented in Table 1-1.

[Evaluation Criteria]
A: The anisotropic conductive film was uniformly laminated on the PET film without causing bending, creasing, or missing of the conductive particle-containing layer, when the releasable base was peeled off.
B: Although bending, creasing, or missing of the conductive particle-containing layer was caused when the releasable base was peeled off, the laminating itself could be performed.
C: Bending, creasing, or missing of the conductive particle-containing layer was caused when the releasable base was peeled off, and the anisotropic conductive film was not uniformly laminated on the PET film.

<Evaluation of Temporary-Fixing Properties>

A PET film having the average thickness of 25 μm was set on a hot stage a temperature of which was adjusted to 70° C. The anisotropic conductive film of the present invention cut into a size of 50 mm×25 mm was arranged on the PET film. After pressing the stuck of the PET film and the anisotropic conductive film by running a hand roller of 5 kg over and back twice, the releasable base (silicone-based release-treated film) was peeled from the anisotropic conductive film.

A three-layer structure flexible printed circuit board (may be referred to as a "FPC" hereinafter), in which the average thickness of the terminal part was 25 μm, was laminated on the resultant. Thereafter, the hand roller of 5 kg was again run the FPC over and back twice for the purpose of temporarily fixing the PET film and the FPC, to thereby produce a temporary-adhered sample. The evaluation was performed based on the following criteria. The result is presented in Table 1-1.

[Evaluation Criteria]
A: There was no problem in the temporary adhesion between the FPC and the PET film, and the FPC and the PET film were not detached from each other.
C: It was difficult to temporarily adhere the FPC and the PET film together, and a temporary-adhered sample could not be produced because the FPC and the PET film were detached from each other.

<Production of Joined Structure>

Two joined structures, Test Pieces A and B, were produced in the following manner.

—Test Piece A—

A three-layer structure FPC (an area of a terminal part: 20 mm×5 mm=100 mm²), in which the average thickness of the terminal part was 25 μm, was used as a target member-1.

A PET film having the average thickness of 25 μm was used as a target member-2. —Test Piece B—

A three-layer structure FPC (an area of a terminal part: 50 mm×25 mm=1,250 mm²), in which the average thickness of the terminal part was 25 μm, was used as a target member-1.

A PET film having the average thickness of 25 μm was used as a target member-2.

A temporary-fixed sample in combination of Test Piece A or Test Piece B was prepared in the same manner as the preparation of the temporary-adhered sample. The temporary-fixed sample was heated and pressed from the side of the target member-1 under the following heat press conditions to thereby obtain a joined structure.

Set temperature of heat source: 110° C.
Set temperature of glass stage: 90° C.
Thrust: 500 kgf/1,250 mm²
Press duration: 3 minutes <<Evaluation for Crushed Particles at in-Plane Center Part>>

A state of crushed conductive particles at a center part of a sample piece was confirmed on the obtained two joined structures (Test Piece A and Test Piece B) by setting each test piece on a metallurgical microscope. The evaluation was performed based on the following criteria. The result is presented in Table 1-1.

[Evaluation Criteria]
A: The conductive particles were crushed, and particle diameters along a plane direction were 1.2 times or greater the particle diameters before being crushed.

B: The conductive particles were crushed, but particle diameters along a plane direction were 1.1 times or greater but less than 1.2 times the particle diameters before being crushed.
C: The conductive particles were crushed, but particle diameters along a plane direction were less than 1.1 times the particle diameters before being crushed.

<<Comprehensive Evaluation>>

The three results of the aforementioned evaluation of laminating properties, evaluation of temporary-fixing properties, and evaluation of crushed particles at an in-plane center part were comprehensively evaluated based on the following evaluation criteria. The result is presented in Table 1-1.

[Evaluation Criteria]
A: All of the three evaluations were A.
B: Among the three evaluations, there was no C, and one or more B.
C: Among the three evaluations, there was one or more C.

Examples 2 to 7

Anisotropic conductive films and joined structures were each produced in the same manner as in Example 1, except that an amount of each adhesive layer-forming component was changed as depicted in Table 1-1.

The obtained anisotropic conductive films and joined structures were evaluated in the same manner as in Example 1. The results are presented in Table 1-1.

Example 8

An anisotropic conductive film and a joined structure were produced in the same manner as in Example 1, except that DESMOCOLL 540 serving as the second crystalline resin A2 was replaced with DESMOCOLL 530 (manufactured by Sumika Bayer Urethane Co., Ltd., a crystalline linear polyurethane resin), and the average thickness of the conductive particle-containing layer after being dried was changed to a thickness depicted in Table 1-2.

The obtained anisotropic conductive film and joined structure were evaluated in the same manner as in Example 1. The results are presented in Table 1-2.

Example 9

An anisotropic conductive film and a joined structure were produced in the same manner as in Example 1, except that ARONMELT PES-111EE serving as the first crystalline resin A1 was replaced with VYLON GA-6400 (manufactured by TOYOBO CO., LTD., a crystalline resin a main component of which was a crystalline polyester resin).

The obtained anisotropic conductive film and joined structure were evaluated in the same manner as in Example 1. The results are presented in Table 1-2.

Examples 10 and 11

Anisotropic conductive films and joined structures were each produced in the same manner as in Example 1, except that the average thickness of the conductive particle-containing layer after being dried was changed to a thickness depicted in Table 1-2.

The obtained anisotropic conductive films and joined structures were evaluated in the same manner as in Example 1. The results are presented in Table 1-2.

Examples 12 to 15

Anisotropic conductive films and joined structures were produced in the same manner as in Example 1, except that an amount of each adhesive layer-forming component was changed as depicted in Table 1-3.

The obtained anisotropic conductive films and joined structures were evaluated in the same manner as in Example 1. The results are presented in Table 1-3.

Comparative Example 1

An anisotropic conductive film and a joined structure were produced in the same manner as in Example 1, except that DESMOCOLL 540 serving as the second crystalline resin A2 was replaced with NIPPOLAN 5196 (manufactured by Nippon Polyurethane Industry Co., Ltd., a polyurethane resin of a polycarbonate skeleton).

The obtained anisotropic conductive film and joined structure were evaluated in the same manner as in Example 1. In Comparative Example 1, laminating and temporary-fixing could not be achieved, and therefore the test for the crushed particles at the in-plane center part could not be performed. The results are presented in Table 1-4.

Comparative Example 2

An anisotropic conductive film and a joined structure were produced in the same manner as in Example 1, except that DESMOCOLL 540 serving as the second crystalline resin A2 was replaced with DESMOCOLL 176 (manufactured by Sumika Bayer Urethane Co., Ltd., a crystalline linear polyurethane resin).

The obtained anisotropic conductive film and joined structure were evaluated in the same manner as in Example 1. The results are presented in Table 1-4.

Comparative Example 3

An anisotropic conductive film and a joined structure were produced in the same manner as in Example 1, except that ARONMELT PES-111EE serving as the first crystalline resin A1 was replaced with ARONMELT PES126E (manufactured by TOAGOSEI CO., LTD., a crystalline resin a main component of which was a crystalline polyester resin).

The obtained anisotropic conductive film and joined structure were evaluated in the same manner as in Example 1. The results are presented in Table 1-4.

TABLE 1-1

|  |  | Ex. 1 | Ex. 2 | Ex. 3 | Ex. 4 | Ex. 5 | Ex. 6 | Ex. 7 |
|---|---|---|---|---|---|---|---|---|
| First crystalline resin A1 | ARONMELT PES-111EE | 80 | 60 | 40 | 70 | 15 | 30 | 80 |
| Second crystalline resin A2 | DESMOCOLL 540 | 40 | 60 | 80 | 70 | 15 | 30 | 40 |
| Amorphous resin A3 | ELITEL UE3500 | 80 | 80 | 80 | 60 | 70 | 140 | 80 |
| Conductive particles | (φ) 10 μm | 5 | 5 | 5 | 5 | 5 | 5 | 5 |
| Average thickness of conductive particle-containing layer (μm) |  | 12 | 12 | 12 | 12 | 12 | 12 | 12 |
| T1° C. | Used room temperature | 23 | 23 | 23 | 23 | 23 | 23 | 23 |
| T2° C. | Endothermic peak temperature at low temperature side | 46 | 46 | 46 | 46 | 46 | 46 | 46 |

TABLE 1-1-continued

|  |  | Ex. 1 | Ex. 2 | Ex. 3 | Ex. 4 | Ex. 5 | Ex. 6 | Ex. 7 |
|---|---|---|---|---|---|---|---|---|
| T3° C. | Temporary-bonding temperature | 70 | 70 | 70 | 70 | 70 | 70 | 70 |
| T4° C. | Endothermic peak temperature at high temperature side | 108 | 108 | 108 | 108 | 108 | 108 | 108 |
| T5° C. | Bonding temperature | 110 | 110 | 110 | 110 | 110 | 110 | 110 |
| T4 − T2 (endothermic peak temperature difference) | | 62 | 62 | 62 | 62 | 62 | 62 | 62 |
| Laminating properties | | A | A | A | A | A | A | A |
| Temporary-fixing properties | | A | A | A | A | A | A | A |
| Crushed particles at in-plane center part | Test Piece A | A | A | A | A | A | A | A |
|  | Test Piece B | A | A | A | A | A | A | A |
| Comprehensive evaluation | | A | A | A | A | A | A | A |

TABLE 1-2

|  |  | Ex. 8 | Ex. 9 | Ex. 10 | Ex. 11 |
|---|---|---|---|---|---|
| First crystalline resin A1 | ARONMELT PES-111EE | 80 | — | 80 | 80 |
|  | VYLON GA-6400 | — | 80 | — | — |
| Second crystalline resin A2 | DESMOCOLL 530 | 40 | — | — | — |
|  | DESMOCOLL 540 | — | 40 | 40 | 40 |
| Amorphous resin A3 | ELITEL UE3500 | 80 | 80 | 80 | 80 |
| Conductive particles | ($\varphi$) 10 μm | 5 | 5 | 5 | 5 |
| Average thickness of conductive particle-containing layer (μm) | | 10 | 12 | 15 | 7 |
| T1 ° C. Used room temperature | | 23 | 23 | 23 | 23 |
| T2 ° C. Endothermic peak temperature at low temperature side | | 43 | 46 | 46 | 46 |
| T3 ° C. Temporary-bonding temperature | | 70 | 70 | 70 | 70 |
| T4 ° C. Endothermic peak temperature at high temperature side | | 108 | 74 | 108 | 108 |
| T5 ° C. Bonding temperature | | 110 | 110 | 110 | 110 |
| T4 − T2 (endothermic peak temperature difference) | | 65 | 28 | 62 | 62 |
| Laminating properties | | A | A | A | B |
| Temporary-fixing properties | | A | A | A | A |
| Crushed particles at in-plane center part | Test Piece A | A | A | A | A |
|  | Test Piece B | A | A | B | A |
| Comprehensive evaluation | | A | A | B | B |

TABLE 1-3

|  |  | Ex. 12 | Ex. 13 | Ex. 14 | Ex. 15 |
|---|---|---|---|---|---|
| First crystalline resin A1 | ARONMELT PES-111EE | 24 | 76 | 39 | 121 |
| Second crystalline resin A2 | DESMOCOLL 540 | 24 | 76 | 121 | 39 |
| Amorphous resin A3 | ELITEL UE3500 | 152 | 48 | 80 | 80 |
| Conductive particles | ($\varphi$) 10 μm | 5 | 5 | 5 | 5 |
| Average thickness of conductive particle-containing layer (μm) | | 12 | 12 | 12 | 12 |
| T1 ° C. Used room temperature | | 23 | 23 | 23 | 23 |
| T2 ° C. Endothermic peak temperature at low temperature side | | 46 | 46 | 46 | 46 |
| T3 ° C. Temporary-bonding temperature | | 70 | 70 | 70 | 70 |
| T4 ° C. Endothermic peak temperature at high temperature side | | 108 | 108 | 108 | 108 |
| T5 ° C. Bonding temperature | | 110 | 110 | 110 | 110 |
| T4 − T2 (endothermic peak temperature difference) | | 62 | 62 | 62 | 62 |
| Laminating properties | | A | A | A | B |
| Temporary-fixing properties | | A | A | A | A |
| Crushed particles at in-plane center part | Test Piece A | A | A | A | A |
|  | Test Piece B | B | B | B | A |
| Comprehensive evaluation | | B | B | B | B |

TABLE 1-4

|  |  | Comp. Ex. 1 | Comp. Ex. 2 | Comp. Ex. 3 |
|---|---|---|---|---|
| First crystalline resin A1 | ARONMELT PES-111EE | 80 | 80 | — |
|  | ARONMELT PES126E | — | — | 80 |
| Second crystalline resin A2 | DESMOCOLL 540 | — | — | 40 |
|  | DESMOCOLL 176 | — | 40 | — |
| Amorphous resin A3 | ELITEL UE3500 | 80 | 80 | 80 |
|  | NIPPOLAN 5196 | 40 | — | — |
| Conductive particles | ($\varphi$) 10 μm | 5 | 5 | 5 |
| Average thickness of conductive particle-containing layer (μm) | | 12 | 12 | 12 |
| T1 ° C. Used room temperature | | 23 | 23 | 23 |
| T2 ° C. Endothermic peak temperature at low temperature side | | — | −26 | 46 |
| T3 ° C. Temporary-bonding temperature | | 70 | 70 | 70 |
| T4 ° C. Endothermic peak temperature at high temperature side | | 108 | 108 | 135 |
| T5 ° C. Bonding temperature | | 110 | 110 | 110 |
| T4 − T2 (endothermic peak temperature difference) | | 108 | 134 | 89 |
| Laminating properties | | C | C | A |
| Temporary-fixing properties | | C | A | A |
| Crushed particles at in-plane center part | Test Piece A | Could not be tested | A | C |
|  | Test Piece B | Could not be tested | A | C |
| Comprehensive evaluation | | C | C | C |

A unit of a blended amount (equal to an amount) of each component in Tables 1-1 to 1-4 is parts by mass.

It was confirmed from Examples 1 to 15 that the anisotropic conductive film of the present invention could assure excellent conduction at a center part, especially for connection with a relatively large area, with maintaining sufficient connection resistance, and had excellent laminating properties at the time of temporary-bonding, excellent temporary-adhesion, and excellent temporary-fixing properties.

It was confirmed from the results of Examples 1 to 7 comparing with Examples 10 and 11 that the excellent results could be obtained when the average thickness of the anisotropic conductive film was from 80% to 140% relative to the average particle diameter of the conductive particles.

Moreover, it was confirmed from the results of Examples 1 to 7 comparing with Examples 14 and 15 that even more excellent conduction could be achieved at a center part for connection with a large area and more excellent temporary-fixing properties could be obtained when the ratio of the mass of the first crystalline resin to the mass of the second crystalline resin was from 25:75 to 75:25.

Furthermore, it was confirmed from the results of Examples 1 to 7 comparing with Examples 12 and 13 that even more excellent conduction could be achieved at a center part for connection with a large area and more excellent temporary-fixing properties could be obtained when the ratio of the sum of the mass (X) of the first crystalline resin and the mass of the second crystalline resin to the mass (Y) of the amorphous resin was (X):(Y)=25:75 to 75:25.

INDUSTRIAL APPLICABILITY

The anisotropic conductive film of the present invention can assure excellent conduction at a center part of connection, particularly with a relatively large area, with maintaining sufficient connection resistance, and has excellent temporary-fixing properties, where a conductive particle-containing film contained in the anisotropic conductive film has appropriate adhesion to a substrate that is a target for connection, and the conductive particle-containing layer and a release film have sufficient releasability and adhesion. Accordingly, the anisotropic conductive film can be suitably used as a connecting material when a terminal of a substrate and a terminal of an electronic component are anisotropically conductively connected to produce a joined structure.

The invention claimed is:

1. An anisotropic conductive film for anisotropically conductively connecting a terminal of a first electronic component and a terminal of a second electronic component, the anisotropic conductive film comprising:
   a conductive particle-containing layer, which contains an adhesive layer-forming component and conductive particles,
   wherein the conductive particle-containing layer has two endothermic peaks in differential scanning calorimetry where endothermic peak temperatures are measured under conditions that a measuring temperature range is from 10° C. to 250° C. and a heating speed is 10° C./min,
   wherein T2 is 30° C. or higher and less than 70° C., and T4−T2 is from 28° C. to 80° C., where T2 is a temperature of the endothermic peak present at a lower temperature side, and T4 is a temperature of the endothermic peak present at a higher temperature side.

2. The anisotropic conductive film according to claim 1, wherein the adhesive layer-forming component contains a crystalline resin.

3. The anisotropic conductive film according to claim 2, wherein the crystalline resin contains at least two crystalline resins including a first crystalline resin and a second crystalline resin.

4. The anisotropic conductive film according to claim 3, wherein the adhesive layer-forming component further contains an amorphous resin.

5. The anisotropic conductive film according to claim 4, wherein a ratio (X):(Y) is from 25:75 to 75:25, where (X) is a sum of a mass of the first crystalline resin and a mass of the second crystalline resin and (Y) is a mass of the amorphous resin.

6. The anisotropic conductive film according to claim 3, wherein a ratio of a mass of the first crystalline resin to a mass of the second crystalline resin is from 25:75 to 75:25.

7. The anisotropic conductive film according to claim 1, wherein an average thickness of the conductive particle-containing layer is from 80% to 140% relative to an average particle diameter of the conductive particles.

8. The anisotropic conductive film according to claim 1, wherein an average particle diameter of the conductive particles is from 2 μm to 40 μm.

9. A connecting method for anisotropically conductively connecting a terminal of a first electronic component and a terminal of a second electronic component, the connecting method comprising:
   arranging the conductive particle-containing layer of the anisotropic conductive film according to claim 1 on the terminal of the second electronic component to perform a first arrangement;
   arranging the first electronic component on the conductive particle-containing layer to bring the terminal of the first electronic component into contact with the conductive particle-containing layer to perform a second arrangement; and
   heating and pressing the first electronic component with a heat-press member.

10. The connecting method according to claim 9, wherein a contact area when the terminal of the first electronic component and the terminal of the second electronic component are anisotropically conductively connected is 100 mm² or greater.

11. A joined structure obtained by anisotropically conductively connecting a first electronic component and a second electronic component via the anisotropic conductive film according to claim 1.

12. An anisotropic conductive film for anisotropically conductively connecting a terminal of a first electronic component and a terminal of a second electronic component, the anisotropic conductive film comprising:
   a conductive particle-containing layer, which contains an adhesive layer-forming component and conductive particles,
   wherein the conductive particle-containing layer has two endothermic peaks in differential scanning calorimetry where endothermic peak temperatures are measured under conditions that a measuring temperature range is from 10° C. to 250° C. and a heating speed is 10° C./min, and
   wherein T2 is 30° C. or higher, and T4−T2 is greater than 0° C. but 80° C. or less, where T2 is a temperature of the endothermic peak present at a lower temperature side, and T4 is a temperature of the endothermic peak present at a higher temperature side,
   wherein the adhesive layer-forming component contains at least two crystalline resins including a first crystalline resin and a second crystalline resin, and further contains an amorphous resin, and
   wherein the first crystalline resin contains crystalline polyester, the second crystalline resin contains a crystalline polyurethane resin, and the amorphous resin contains an amorphous polyester resin.

13. A connecting method for anisotropically conductively connecting a terminal of a first electronic component and a terminal of a second electronic component, the connecting method comprising:
   arranging the conductive particle-containing layer of the anisotropic conductive film according to claim 12 on the terminal of the second electronic component to perform a first arrangement;
   arranging the first electronic component on the conductive particle-containing layer to bring the terminal of the first electronic component into contact with the conductive particle-containing layer to perform a second arrangement; and heating and pressing the first electronic component with a heat-press member.

14. The connecting method according to claim 13, wherein a contact area when the terminal of the first electronic component and the terminal of the second electronic component are anisotropically conductively connected is 100 mm² or greater.

15. A joined structure obtained by anisotropically conductively connecting a first electronic component and a second electronic component via the anisotropic conductive film according to claim 12.

* * * * *